United States Patent [19]
Kasai

[11] Patent Number: 5,905,283
[45] Date of Patent: May 18, 1999

[54] METHOD OF FORMING A MOS TRANSISTOR HAVING GATE INSULATORS OF DIFFERENT THICKNESSES

[75] Inventor: Naoki Kasai, Tokyo, Japan

[73] Assignee: NEC Corporation, Tokyo, Japan

[21] Appl. No.: 08/848,266

[22] Filed: Apr. 29, 1997

Related U.S. Application Data

[62] Division of application No. 08/510,126, Aug. 1, 1995, Pat. No. 5,811,336.

[30] Foreign Application Priority Data

Aug. 31, 1994 [JP] Japan .................................. 6-206443

[51] Int. Cl.[6] .................................................... H01L 29/76
[52] U.S. Cl. .......................... 257/334; 257/330; 257/365
[58] Field of Search .................................. 257/365, 366, 257/368, 369, 371, 379, 394–397, 296, 302, 330–334

[56] References Cited

U.S. PATENT DOCUMENTS

| | | | |
|---|---|---|---|
| 4,119,996 | 10/1978 | Jhabvala ................................... | 357/23 |
| 4,198,693 | 4/1980 | Kuo ......................................... | 365/104 |
| 4,502,208 | 3/1985 | McPherson ............................. | 257/296 |
| 4,937,202 | 6/1990 | Maas ....................................... | 257/365 |
| 4,992,390 | 2/1991 | Chang ..................................... | 437/42 |
| 5,034,341 | 7/1991 | Itoh ......................................... | 437/52 |
| 5,084,402 | 1/1992 | Uchida et al. ........................... | 437/33 |
| 5,285,096 | 2/1994 | Ando et al. ............................. | 257/365 |
| 5,460,985 | 10/1995 | Tokura et al. ........................... | 437/40 |
| 5,480,823 | 1/1996 | Hsu ......................................... | 437/48 |
| 5,501,996 | 3/1996 | Yang et al. ............................. | 437/43 |

OTHER PUBLICATIONS

Runyan et al., Semiconductor Integrated Circuit Processing Technology, pp. 53, 84–88, 90–92, 95, 1990.

*Primary Examiner*—Sara Crane
*Attorney, Agent, or Firm*—Whitham, Curtis & Whitham

[57] ABSTRACT

The semiconductor device includes (A) a first MOS transistor including (a) a main surface at a part of which recesses are formed, an inner surface of the recesses defining a crystal plane being able to be thermally oxidized at higher speed than the main surface, and (b) an insulator formed on the inner surface of the recesses, the inner surface of the recesses working as a channel region and the insulator working as a gate insulator in the first MOS transistor, and (B) a second MOS transistor in which the main surface works as a channel region and an insulator formed on the main surface works as a gate insulator, the gate insulator of the first MOS transistor having a greater thickness than that of the gate insulator of the second MOS transistor. Thus, above the thinner gate insulator is formed the second MOS transistor, while above the thicker gate insulator is formed the first MOS transistor having a higher breakdown voltage than that of the second MOS transistor. Thus, the number of steps for forming insulators having different thicknesses can be reduced relative to prior methods. In addition, a resist layer is not directly deposited on a gate insulator unlike prior methods, a gate insulator is not contaminated with impurities.

18 Claims, 10 Drawing Sheets

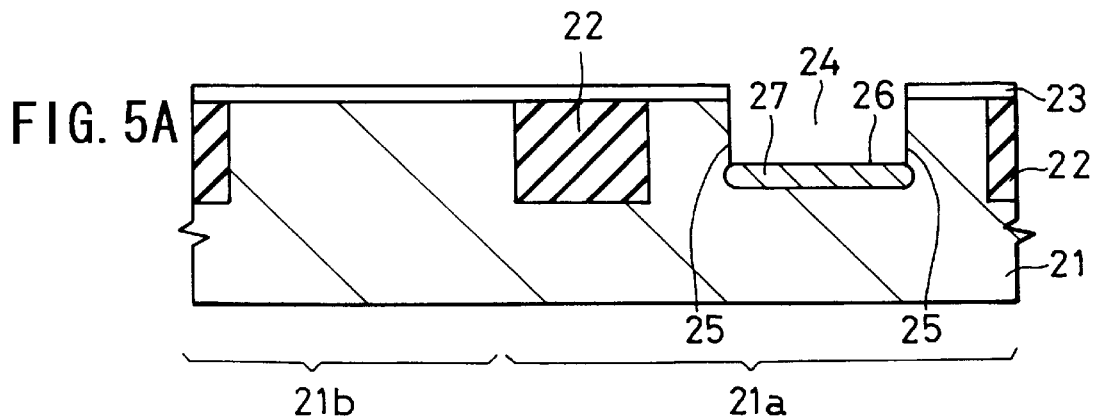
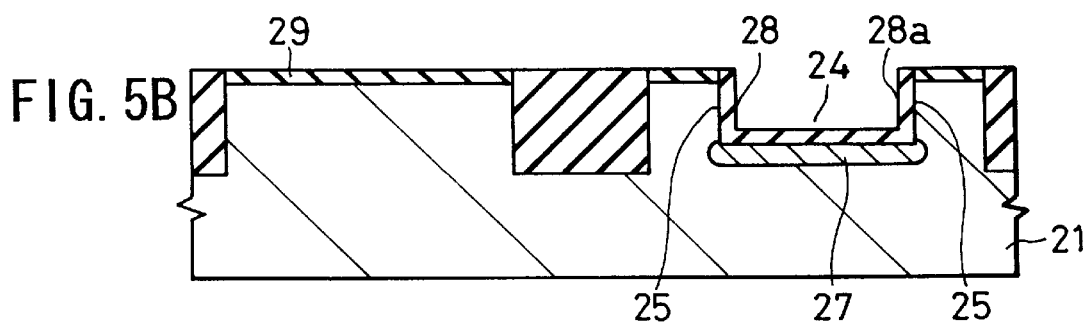
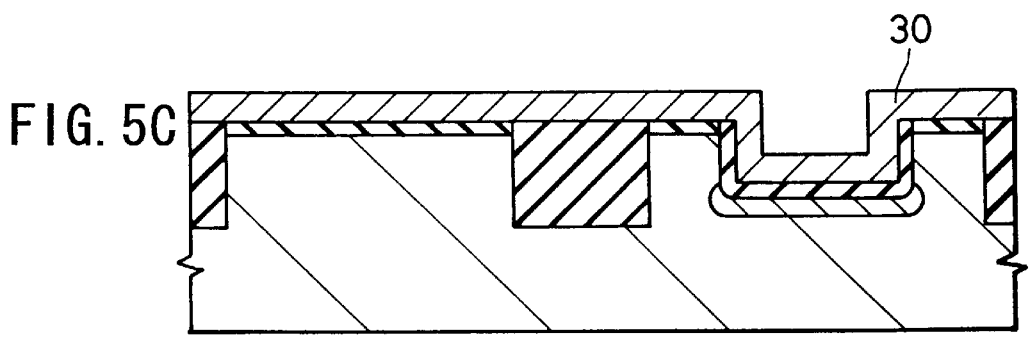
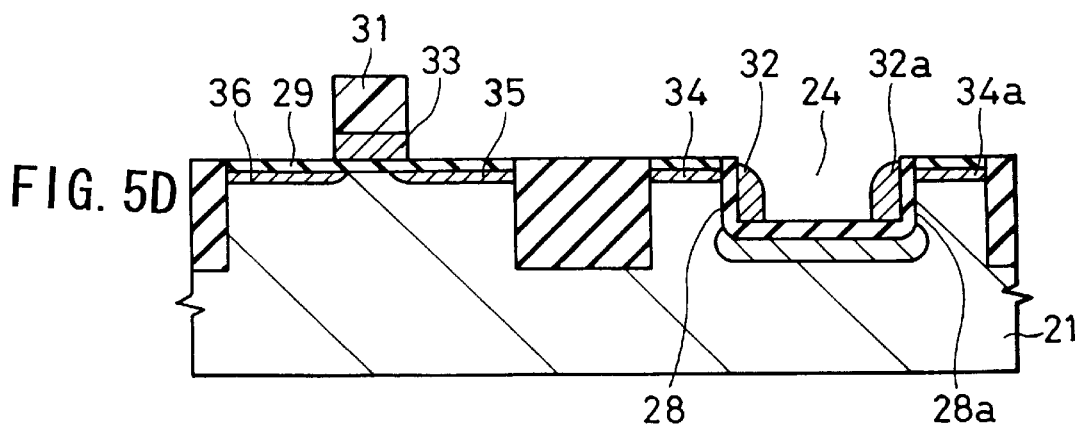

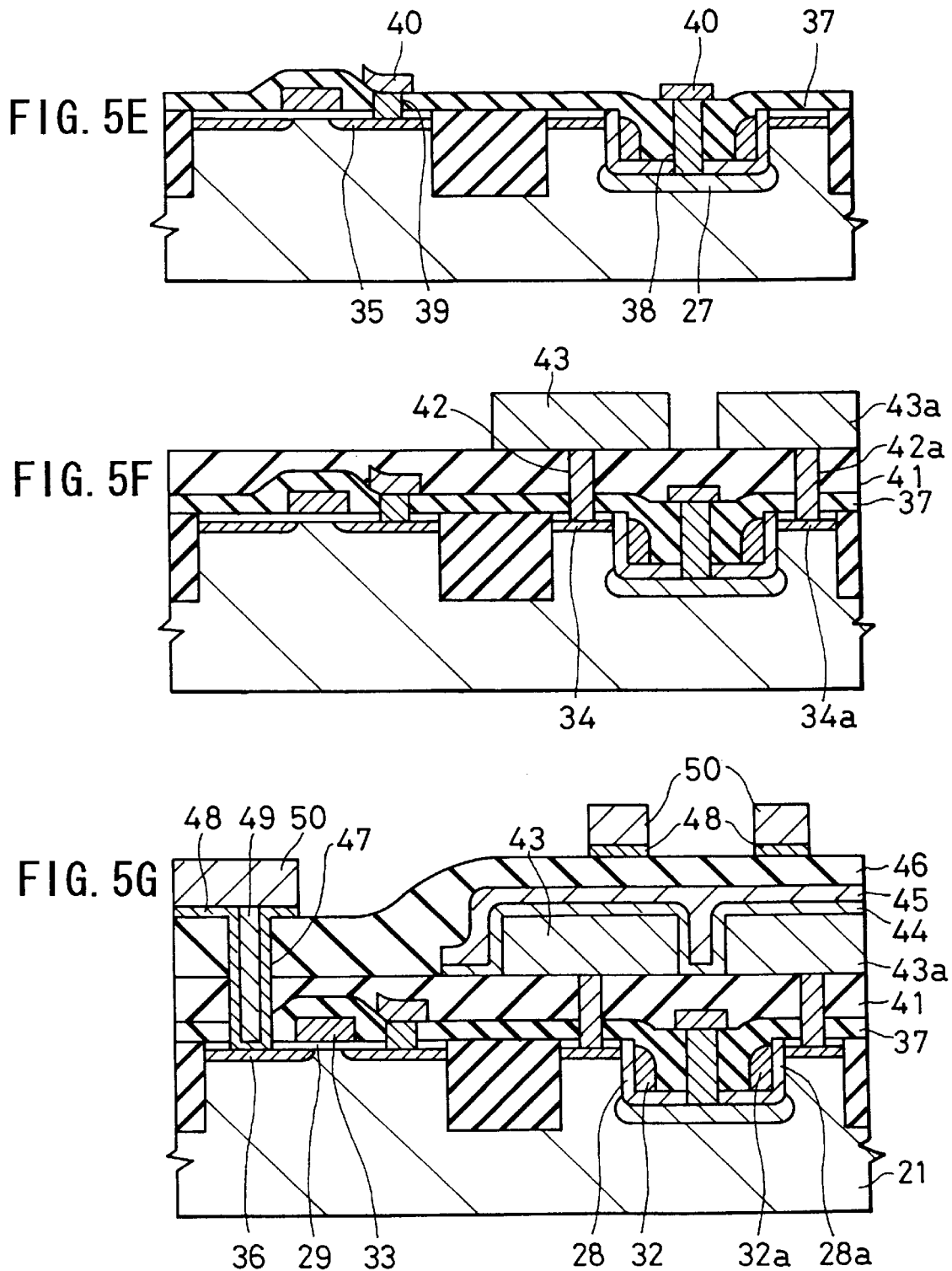

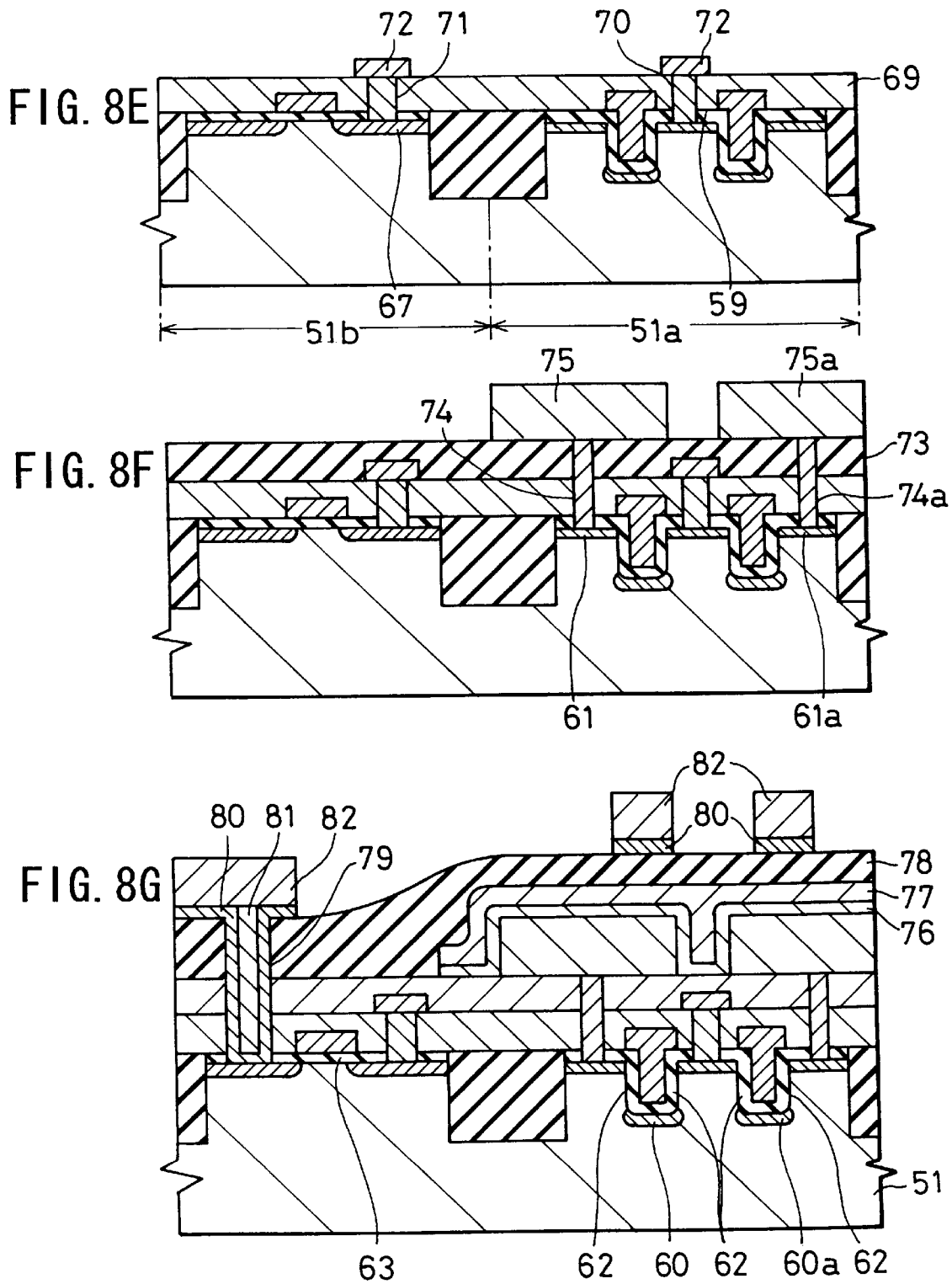

METHOD OF FORMING A MOS TRANSISTOR HAVING GATE INSULATORS OF DIFFERENT THICKNESSES

CROSS REFERENCE TO RELATED APPLICATION

This application is a divisional of application Ser. No. 08/510,126 filed Aug. 1, 1995, now U.S. Pat. No. 5,811,336.

BACKGROUND OF THE INVENTION

1. Field of the Invention

The invention relates to a semiconductor device and a method for fabricating the same, and more particularly to a MOS transistor including gate insulators having different thicknesses and a method for fabricating the same.

2. Description of the Related Art

In response to the requirement of higher integration and higher operation speed of a semiconductor device, fabrication technologies have been developed for fabricating a semiconductor element in more minute size and in higher density. It is also required for a semiconductor device to consume lower electrical power and to operate with a lower voltage. These are for responding to scaling down dimension and portability of an apparatus into which a semiconductor device is to be incorporated, and also for preventing malfunction of a semiconductor device to be caused due to increased heat derived from a semiconductor element which is accompanied with higher integration and higher operation speed of a semiconductor device.

If a voltage for operating a semiconductor element is reduced in order to lower electrical power consumption and a voltage at which a semiconductor device is operated, an operation speed of the semiconductor element and hence an operation speed of a semiconductor device including the semiconductor element is also reduced. One of approaches for satisfying the above mentioned requirements contrary to each other is to use two or more operational voltages in a semiconductor device.

A plurality of operational voltages are used also for adequately working a part of circuits constituting a semiconductor device. In such a structure, a semiconductor device is provided with a circuit for increasing a voltage or a circuit for decreasing a voltage in order to generate a desired voltage different from a supply voltage to be supplied to a semiconductor device. The use of a plurality of voltages for operating a semiconductor device makes it possible to apply a plurality of voltages to a gate insulator of a MOS transistor.

With fabrication of a semiconductor element in more minute size, a gate insulator is made thinner. However, if a thickness of gate insulators is uniformly reduced, such gate insulators cannot be used for the above mentioned plurality of voltages for operating a semiconductor device. Namely, if the highest voltage among the plurality of operation voltages is applied, insulating properties of a thinner formed gate insulator is deteriorated. Thus, it is necessary for a gate insulator of a MOS transistor to which a higher voltage is to be applied to have a greater thickness, and for a gate insulator of a MOS transistor to which a lower voltage is to be applied to have a smaller thickness.

For this reason, methods have been developed for forming gate insulators having different thicknesses in a semiconductor device. For instance, Japanese Unexamined Patent Public Disclosure No. 5-291573 laid open on Nov. 5, 1993 has suggested one of such methods.

Hereinbelow will be explained the method, suggested in No. 5-291573, for fabricating a MOS transistor including gate insulators having different thicknesses with reference to FIGS. 1A to 1D which are cross-sectional views of a MOS transistor and arranged in an order with which fabrication steps are carried out.

First, as illustrated in FIG. 1A, a plurality of insulator films 102 for isolating elements from each other are selectively formed on a p-type semiconductor substrate 101 by LOCOS. Then, the insulative films 102 are selectively etched for removal to thereby form recesses 103 (only one of them is illustrated in FIGS. 1A to 1D) at a location where the removed insulative films 102 used to exist.

Then, a gate insulator having a thickness of about 18 nm is deposited by thermal oxidation on exposed surface of the p-type semiconductor substrate 101. Then, as illustrated in FIG. 1B, a resist layer 104 is patterned by means of photolithography over an area B which includes a recess 103 and in which a MOS transistor having a high breakdown voltage of gate oxide is to be fabricated. Then, a gate insulator disposed in an area A is etched for removal with the patterned resist layer 104 serving as a mask- In the area A, a MOS transistor having a normal breakdown voltage is to be fabricated. Thus, a first gate insulator 105 is formed in the area B in which a MOS transistor having a high breakdown voltage of gate oxide is to be fabricated.

After the patterned resist layer 104 has been removed, a resultant is subject to thermal oxidation again to thereby form a second gate insulator 106 having a thickness of about 18 nm in the area A. As illustrated in FIG. 1C, since in the area B has been already formed the first gate insulator 105, the thermal oxidation makes an additional insulator over the first gate insulator 105 with the result that a first insulator 105a having a thickness of about 25 nm is newly formed in the area B.

Then, as illustrated in FIG. 1D, a gate electrode 107, a source diffusion layer 109, and a drain diffusion layer 110 are formed in a conventional manner for a MOS transistor having a high breakdown voltage of a gate insulator. In the same way, a gate electrode 108, a source diffusion layer 111, and a drain diffusion layer 112 are formed in the area A in a conventional manner for a MOS transistor having a normal breakdown voltage.

As having been explained, in the prior method, in order to form the gate insulators 105a and 106 having different thicknesses, the first gate insulator 105 is first deposited, then the first gate insulator 105 is selectively removed in predetermined areas, and then the second gate insulator 106 is deposited all over a resultant.

The above mentioned prior method needs two steps for thermally oxidizing a semiconductor substrate, a step of photolithography, and a step for etching a gate insulator in order to form gate insulators having different thicknesses.

In addition, the above mentioned prior method needs a step for patterning a resist layer between first and second thermal oxidations in formation of a gate insulator of a MOS transistor to which a relatively high voltage is to be applied. For this reason, contamination of a gate insulator with impurities such as heavy metal is not avoidable, and hence quality and/or reliability of a gate insulator is deteriorated. Since the resist layer 104 is in direct contact with the gate insulator 105 in the above mentioned method, heavy metal contained in the resist layer is prone to containinate the gate insulator 105. Thus, it is necessary to provide countermeasure for avoiding such contamination.

SUMMARY OF THE INVENTION

In view of the foregoing problems, it is an object of the present invention to provide a MOS transistor including gate insulators of different thicknesses, and a method for fabricating such a MOS transistor.

The invention provides a semiconductor device including (A) a first MOS transistor having (a) a main surface at a part of which recesses are formed, an inner surface of the recesses defining a crystal plane being able to be thermally oxidized at higher speed than the main surface, and (b) an insulator formed on the inner surface of the recesses, the inner surface of the recesses working as a channel region and the insulator working as a gate insulator in the first MOS transistor, and (B) a second MOS transistor in which the main surface works as a channel region and an insulator formed on the main surface works as a gate insulator, the gate insulator of the first MOS transistor having a greater thickness than that of the gate insulator of the second MOS transistor.

The invention further provides a method for fabricating a semiconductor device, including the steps of (a) selectively forming insulators for isolating elements from each other on a surface of a semiconductor substrate, (b) etching surfaces of the semiconductor device and the insulators to thereby form recesses on the surfaces, (c) thermally oxidizing the surfaces to thereby form a gate insulator thereon, (d) depositing a thin conductive layer all over a resultant, and (e) anisotropically dry etching the thin conductive layer.

The invention still further provides a method for fabricating a semiconductor device, including the steps of (a) selectively forming insulators for isolating elements from each other on a surface of a semiconductor substrate, the surface of a semiconductor substrate having a first crystal plane orientation, (b) etching surfaces of the semiconductor device and the insulators to thereby form recesses on the surfaces, the recesses having a surface having a second crystal plane orientation, the second crystal plane orientation having a higher thermal oxidation speed than that of the surface of a semiconductor substrate, (c) thermally oxidizing the surfaces to thereby form a gate insulator thereon, (d) depositing a thin conductive layer all over a resultant, and (e) anisotropically dry etching the thin conductive layer.

The advantages obtained by the aforementioned present invention will be described hereinbelow.

In the method in accordance with the invention, a silicon substrate is formed on a main surface thereof in predetermined areas with recesses to thereby expose a crystal plane having a higher thermal oxidation speed than that of the main surface of the substrate. For instance, the main surface has (100) orientation, while an inner surface of the recesses has (110) orientation. Then, the silicon substrate is thermally oxidized. Thus, two gate insulators having different thicknesses are formed on the main surface of the silicon substrate and on the inner surface of the recesses. Above the thicker gate insulator is formed a MOS transistor having a higher breakdown voltage of a gate insulator, while above the thinner gate insulator is formed a MOS transistor having a normal breakdown voltage of a gate insulator.

The method in accordance with the invention enables to reduce the number of steps for forming gate insulators having different thicknesses to two-thirds or less of the number of steps of prior methods.

In addition, a gate insulator is not in direct contact with a resist layer unlike prior methods. Thus, contamination of a gate insulator with heavy metal contained in a resist layer can be prevented, and hence high quality of a gate insulator is preserved.

Furthermore, since a MOS transistor having a higher breakdown voltage of gate oxide is formed in the recesses, it is made easy to accomplish high integration and high densification of a semiconductor device.

The above and other objects and advantageous features of the present invention will be made apparent from the following description made with reference to the accompanying drawings, in which like reference characters designate the same or similar parts throughout the drawings.

BRIEF DESCRIPTION OF THE DRAWINGS

FIGS. 5A to 5F are cross-sectional views showing each step of a method for fabricating a semiconductor device in accordance with the second embodiment of the invention, each step being arranged in an order with which the steps are carried out;

FIGS. 8A to 8G are cross-sectional views showing each step of a method for fabricating a semiconductor device in accordance with the third embodiment of the invention, each step being arranged in an order with which the steps are carried out.

DESCRIPTION OF THE PREFERRED EMBODIMENTS

Preferred embodiments in accordance with the present invention will be explained hereinbelow with reference to drawings.

Embodiment 1

Figure 1A:
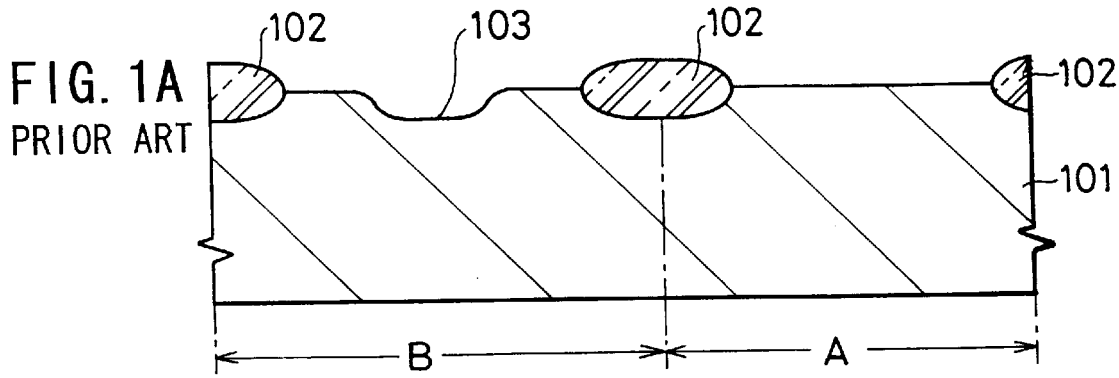
FIGS. 1A to 1D are cross-sectional views for showing each step of a prior method for fabricating a semiconductor device, each step being arranged in an order with which the steps are carried out.
Figure 1B:
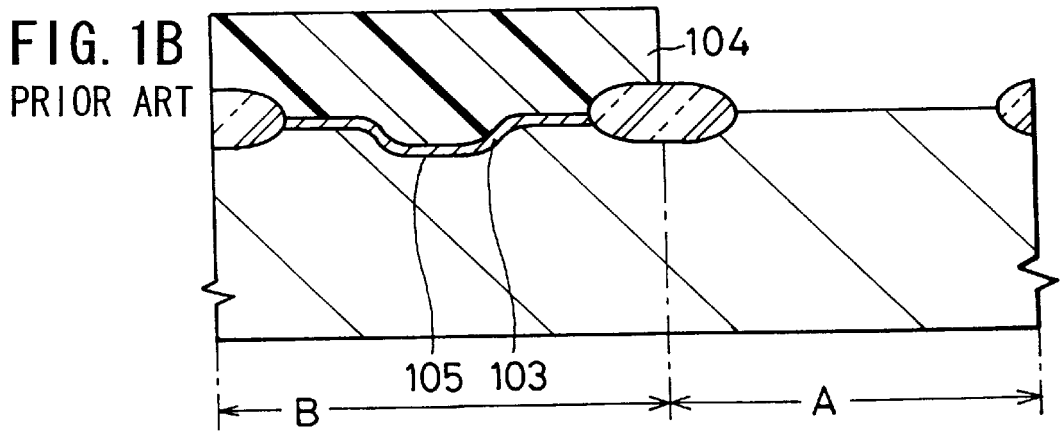
Figure 1C:
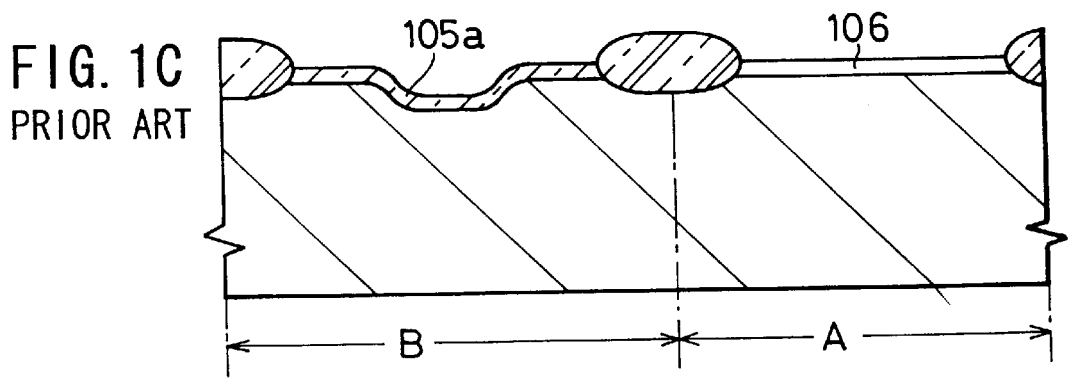
Figure 1D:
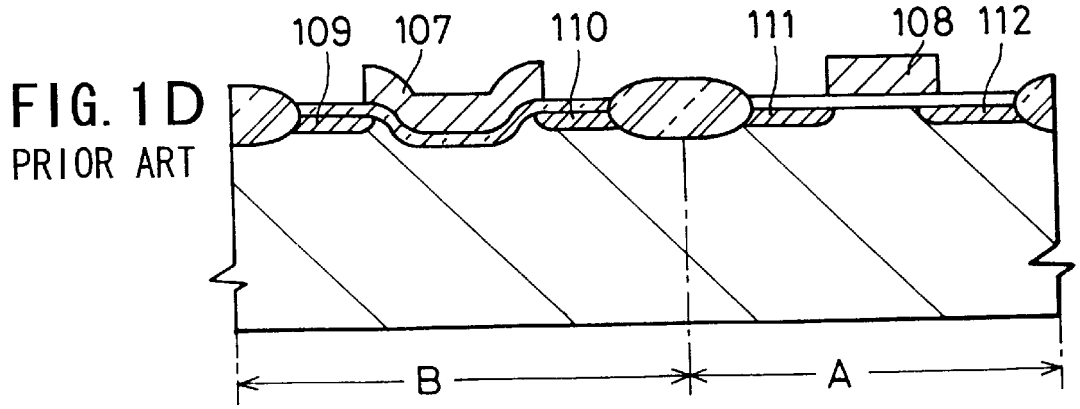
Figure 2:
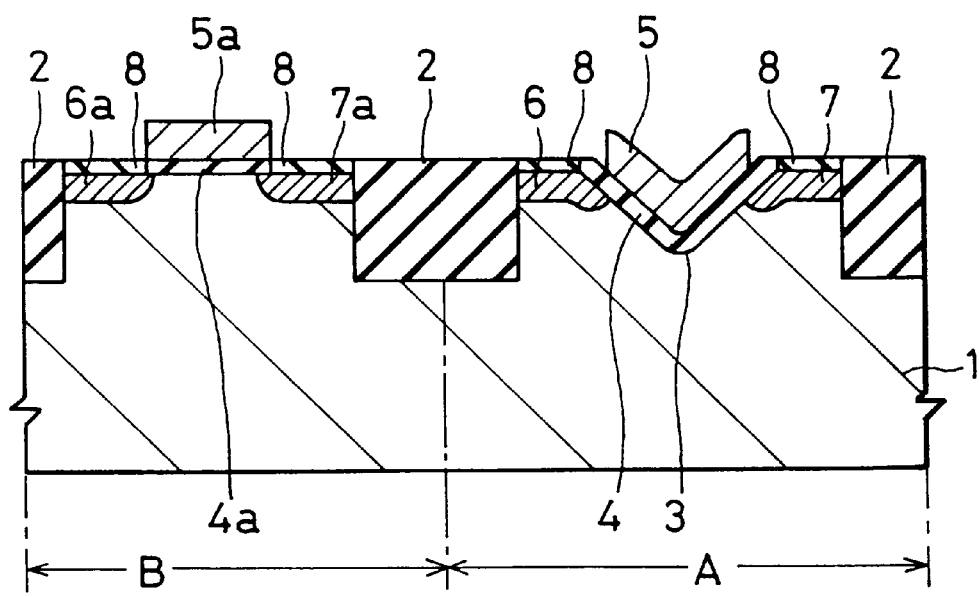
FIG. 2 is a cross-sectional view of a semiconductor device in accordance with the first embodiment of the invention.

FIG. 2 illustrates a semiconductor device in accordance with the first embodiment of the invention. In the semiconductor device, an area A in which a MOS transistor having a high breakdown voltage of a gate insulator is to be fabricated is disposed adjacent to an area B in which a MOS transistor having a normal breakdown voltage of a gate insulator is to be fabricated.

On a main surface of a p-type silicon substrate 1 having (100) orientation is formed a plurality of insulators 2 for electrically isolating adjacent elements from each other. In the area A is formed a V-shaped recess 3 having a (111) orientation crystal plane or a crystal plane equivalent thereto (hereinafter, referred to simply as a (111) orientation crystal plane). The V-shaped recess 3 has a depth up to 0.5 $\mu$m. The insulators 2 have a depth up to 1 $\mu$m. The insulators 2 preferably have a greater depth than that of the V-shaped recess 3.

The silicon substrate 1 has a silicon oxide layer thereon formed by thermal oxidation. Thus, along an inner surface of the V-shaped recess 3 is oxidized a first gate insulator 4. The first gate insulator 4 typically has a thickness up to 20 $\mu$m.

On the gate insulator 4 is formed a gate electrode 5 of a MOS transistor having a high breakdown voltage of a gate oxide layer. At opposite sides of the V-shaped recess 3 is formed a source diffusion layer 6 and a drain diffusion layer 7.

On the other hand, a MOS transistor having a normal breakdown voltage of a gate insulator is formed on a flat main surface of the silicon substrate 1 within the area B. As illustrated in FIG. 2, a second gate insulator 4a is formed on a flat surface of the silicon substrate 1, and a gate electrode 5a is formed on the second gate insulator 4a. At opposite sides of the gate electrodes 5a are formed a source diffusion layer 6a and a drain diffusion layer 7a. Thus, a normal MOS transistor is completed. The second gate insulator 4a is designed to have a smaller thickness than that of the first gate insulator 4.

A protection insulator 8 is formed in a thermal oxidation step to be carried out for depositing the first and second gate insulators 4 and 4a, and is to be used for ion implantation of impurities therethrough for forming source/drain diffusion layers therebelow.

Since the first gate insulator 4 has a greater thickness than a thickness of the second gate insulator 4a, it is possible to apply a higher voltage to the gate electrode 5 than that of the gate electrode 5a.

In addition, since a channel region of a MOS transistor having a high breakdown voltage of a gate insulator is formed on an inner surface of the V-shaped recess 3, the MOS transistor can obtain a longer effective channel length than that of a MOS transistor formed on a flat surface of a silicon substrate. For this reason, even if a thickness of the gate insulator is formed thicker, the MOS transistor does scarcely receive influence of short channel effect, and hence MOS transistor properties are not deteriorated.

Figure 3A:
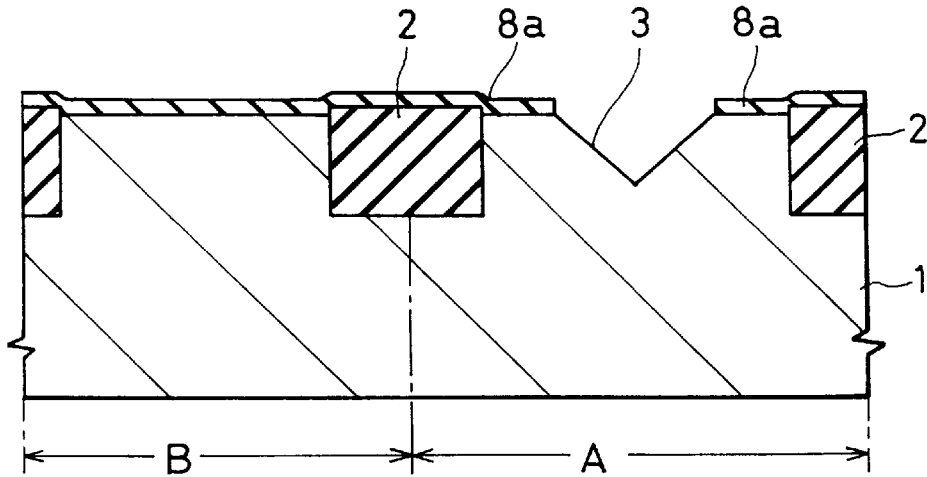
FIGS. 3A to 3C are cross-sectional views showing each step of a method for fabricating the semiconductor device illustrated in FIG. 2, each step being arranged in an order with which the steps are carried out.
Figure 3B:
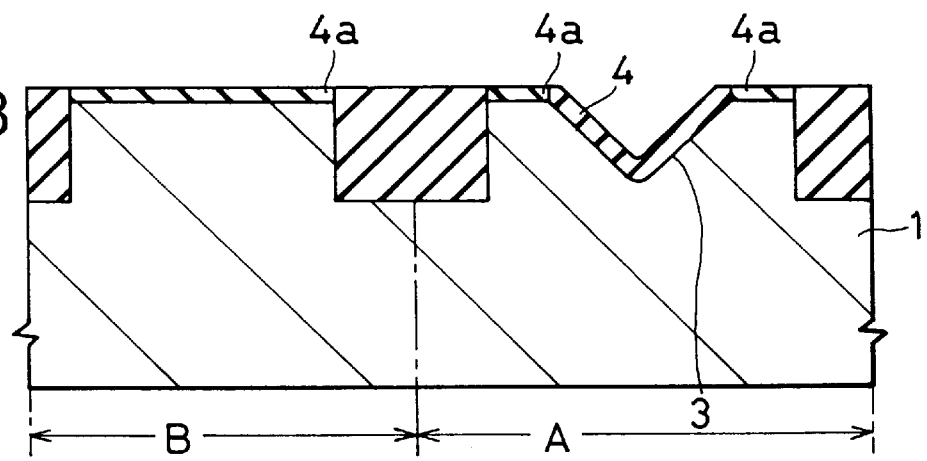
Figure 3C:
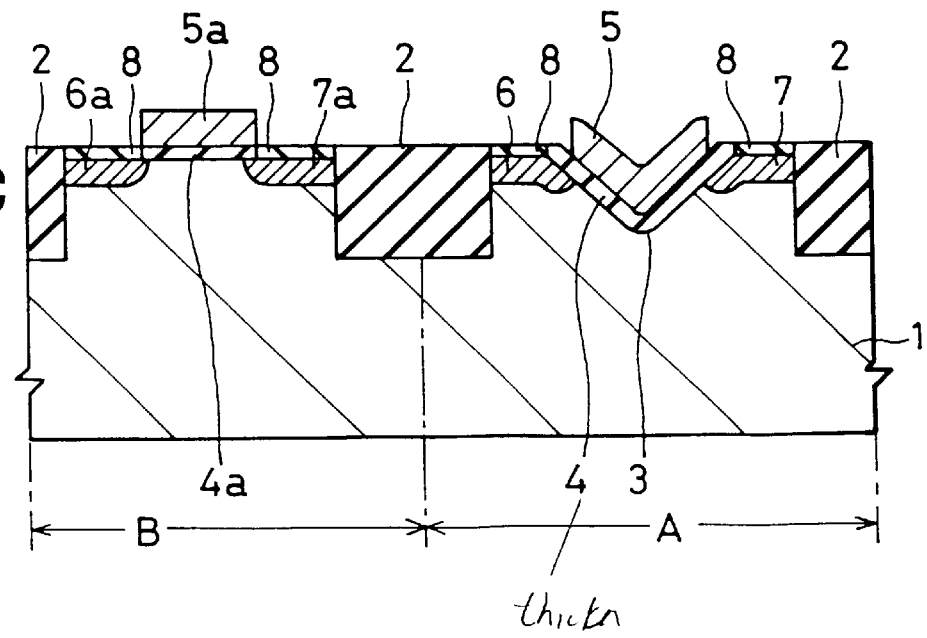

Hereinbelow will be explained a method for fabricating a semiconductor device including the above mentioned MOS transistor having a high breakdown voltage of a gate insulator, with reference to FIGS. 3A to 3C. FIGS. 3A to 3C are arranged in an order with which a method for fabricating a semiconductor device in accordance with the first embodiment of the invention is carried out. In an area A is to be formed a MOS transistor having a high breakdown voltage of a gate insulator, while in an area B is to be formed a MOS transistor having a normal breakdown voltage of a gate insulator.

First, as illustrated in FIG. 3A, a plurality of the insulators 2 for isolating elements from each other are selectively formed on a main surface of the p-type silicon substrate having (100) orientation to thereby define the areas A and B. The insulators 2 are formed by forming trenches having a depth in the range of 0.5 $\mu$m to 1 $\mu$m in predetermined areas on a main surface of the silicon substrate 1, and subsequently by filling the trenches with insulative material such as silicon dioxide.

Then, an oxide layer 8a is patterned on the main surface of the silicon substrate 1 so that only predetermined areas are exposed. As will be mentioned later, a MOS transistor having a high breakdown voltage of a gate oxide layer is formed within the predetermined areas. Then, the silicon substrate 1 is etched with the mask oxide layer 8a serving as a mask. The etching is carried out by soaking the silicon substrate 1 into a solvent containing hydrazine ($NH_2 \cdot NH_2$) or potassium hydroxide (KOH) therein. By the etching of the silicon substrate 1, only (111) oriented crystal planes are kept to remain, and there are formed V-shaped recesses 3 (only one of them is illustrated in FIGS. 1A to 1D). An exposed surface of the V-shaped recess 3 is (111) oriented crystal plane.

Then, the oxide layer 8a is removed to thereby expose a flat main surface of the silicon substrate 1 having (100) orientation as well as the slant surface of the V-shaped recess 3 having (111) orientation.

Then, as illustrated in FIG. 3B, the silicon substrate 1 is thermally oxidized. By the thermal oxidation, a first gate insulator 4 is formed on the slant surface of the V-shaped recess 3 having (111) orientation. At the same time, a second gate insulator 4a is also formed on the flat main surface of the silicon surface 1 having (100) orientation. These gate insulators 4 and 4a are composed of silicon dioxide. The first gate insulator 4 has a greater thickness than that of the second gate insulator 4a.

Figure 4:
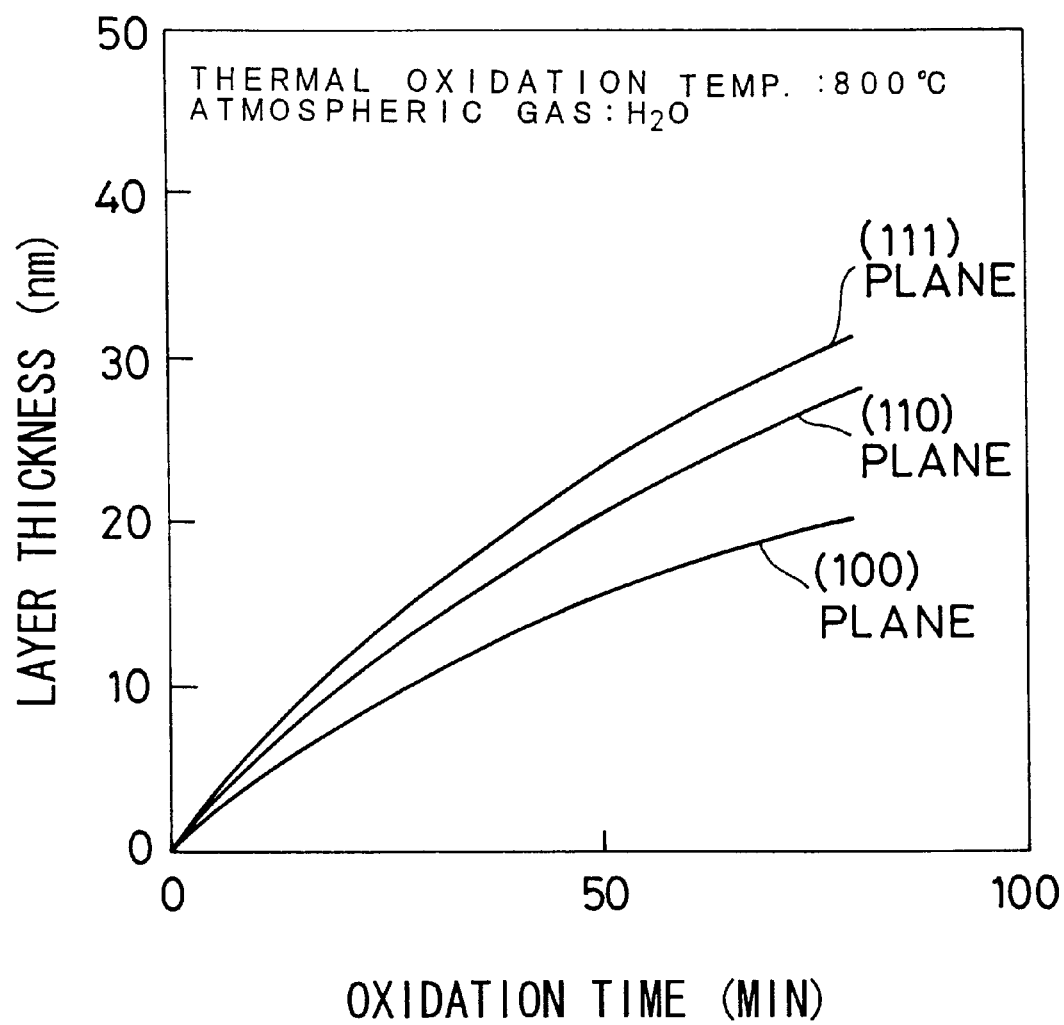
FIG. 4 is a graph showing the dependency of a thickness of a gate oxide layer on crystal plane orientation.

Such a difference in gate insulator thickness is caused due to a difference in crystal plane of single crystal silicon. Hereinbelow is explained a mechanism about how such a difference in gate insulator thickness is produced, with reference to FIG. 4. FIG. 4 shows a relationship between thermal oxidation time and a thickness of a silicon dioxide layer grown on crystal planes having (100), (110), and (111) Si orientations. Thermal oxidation temperature is 800 degrees centigrade, and atmospheric gas for oxidation is $H_2O$. As is obvious from FIG. 4, thermal oxidation speed is greatest in (111) orientation, and smallest in (100) orientation. That is, thermal oxidation speed is represented as follows:

(111)>(110)>(100)

For instance, within a period of time in which a silicon oxide layer having a thickness of about 15 nm is formed on (111) oriented crystal plane, about 13 nm and about 10 nm thick silicon oxide layers are formed on (110) and (100) oriented crystal planes, respectively.

A difference in a silicon dioxide layer thickness caused due to crystal planes of single crystal silicon becomes greater as thermal oxidation temperature is smaller. For instance, when thermal oxidation temperature is 700 degrees centigrade, within a period of time in which a silicon dioxide layer having a thickness of about 15 nm is formed on (111) oriented crystal plane, about 12 nm and about 7 nm thick silicon dioxide layers are formed on (110) and (100) oriented crystal planes, respectively. In addition, such a difference in a silicon dioxide layer thickness becomes greater when $O_2$ is used as atmospheric gas than when $H_2O$ is used as atmospheric gas. Thus, it is possible to control a difference in a silicon dioxide layer thickness caused due to crystal planes of single crystal silicon by varying thermal oxidation conditions such as thermal oxidation temperature and atmospheric gas for thermal oxidation.

Thus, it is possible to arrange a thickness of the first gate insulator 4 to be 1.5 to 2 times greater than a thickness of the second gate insulator 4a.

Then, over a resultant is deposited and patterned a thin polysilicon layer or a thin tungsten polycide layer containing phosphorus impurities to thereby form a gate electrode 5 on the first gate insulator 4 and a gate electrode 5a on the second gate insulator 4a, as illustrated in FIG. 3C. In the formation of the gate electrode 5, it is necessary to form the gate electrode 5 only within the V-shaped recess 3 and not to form the gate electrode 5 outside the V-shaped recess 3. This is to prevent the gate electrode 5 from overlying on a thin silicon dioxide layer formed on the flat main surface of the silicon substrate.

Then, arsenic (As) ions are implanted to a resultant through protection insulators 8 to thereby diffuse source diffusion layers 6, 6a and drain diffusion layers 7, 7a. Thus, in the V-shaped recess 3 is formed a MOS transistor having a high breakdown voltage of a gate oxide layer, while on the flat main surface of the silicon substrate 1 is formed a MOS transistor having a normal breakdown voltage of a gate oxide layer. The protection insulators 8 are a portion of the second gate insulator 4a, namely, silicon dioxide layers through which arsenic ions are to be implanted into the silicon substrate 1.

Embodiment 2

Figure 6:
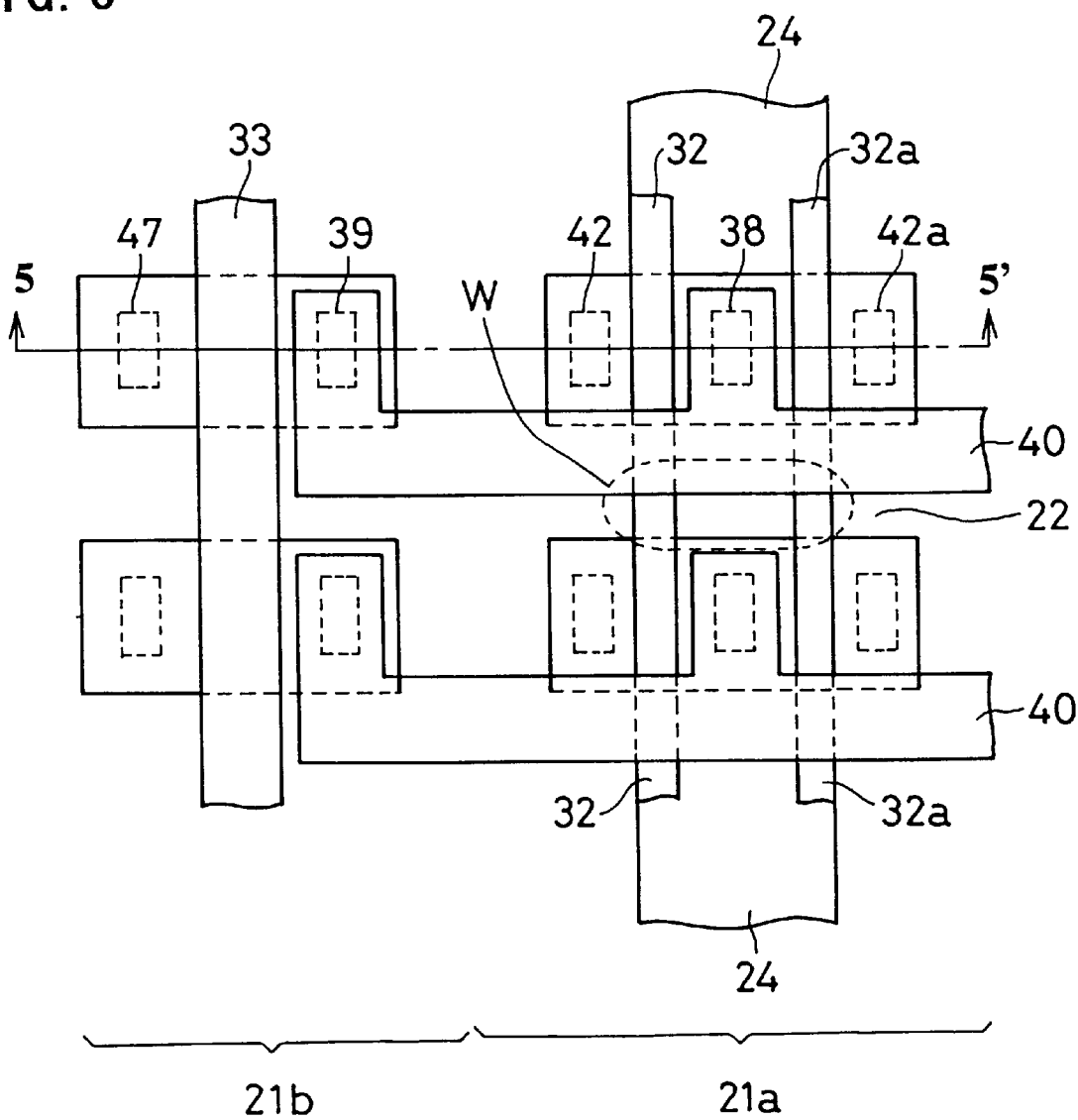
FIG. 6 is a top plan view of a semiconductor device in accordance with the second embodiment of the invention.

Hereinbelow will be explained a semiconductor device and a method of forming the same in accordance with the second embodiment of the invention with reference to FIGS. 5A to 5G and 6. FIGS. 5A to 5G are arranged in an order with which the method of fabricating a semiconductor device in accordance with the second embodiment is carried out. In the second embodiment, a semiconductor device in accordance with the invention is to be applied to DRAM. FIG. 6 is a top plan view of memory cell region and peripheral circuits region of the DRAM. FIGS. 5A to 5G are cross-sectional views taken along the line 5–5' in FIG. 6.

As illustrated in FIG. 5A, a plurality of insulators 22 for isolating elements from each other is formed on a main surface of a p-type silicon substrate 21 having (100) orientation to thereby define a memory cell area 21a and a peripheral circuit area 21b. Each of the insulators 22 has a depth of about 1 μm. Then, an oxide layer 23 is patterned on the main surface of the silicon substrate 21 so that predetermined areas are exposed. In the predetermined areas are to be formed a MOS transistor having a high breakdown voltage of a gate insulator, as mentioned later. The silicon substrate 21 is etched with the mask oxide layer 23 serving as a mask to thereby form a trench 24 in the predetermined areas within the memory cell area 21a. The trench 24 has a depth of about 0.5 μm. The trench 24 is formed so that side walls 25 of the trench 24 defines a crystal plane having (110) Si orientation or equivalents thereof. A bottom surface 26 of the trench 24 has (100) Si orientation. Then, arsenic (As) ions are implanted to the silicon substrate 21 to thereby form a bit line diffusion layer 27 below the bottom 26 of the trench 24. Dose of arsenic ion implantation is set to be about $1 \times 10^{15}$ atoms/cm$^2$ so that the bit line diffusion layer 27 contains arsenic by $5 \times 10^{19}$ atoms/cm$^3$.

Next, the silicon substrate 21 is thermally oxidized at 800 degrees centigrade in the presence of H$_2$O as atmospheric gas for oxidation. As illustrated in FIG. 5B, the thermal oxidation causes first gate insulators 28 and 28a composed of silicon dioxide and having a thickness in the range of 12 nm to 14 nm to be formed on the side walls 25 and the bottom surface 26 of the trench 24. The thermal oxidation also causes a second gate insulator 29 or a silicon dioxide layer having a thickness of about 8 nm to be formed on the flat main surface of the silicon substrate 21 or on the crystal plane of the peripheral circuit region 21b having (100) orientation.

Figure 7:
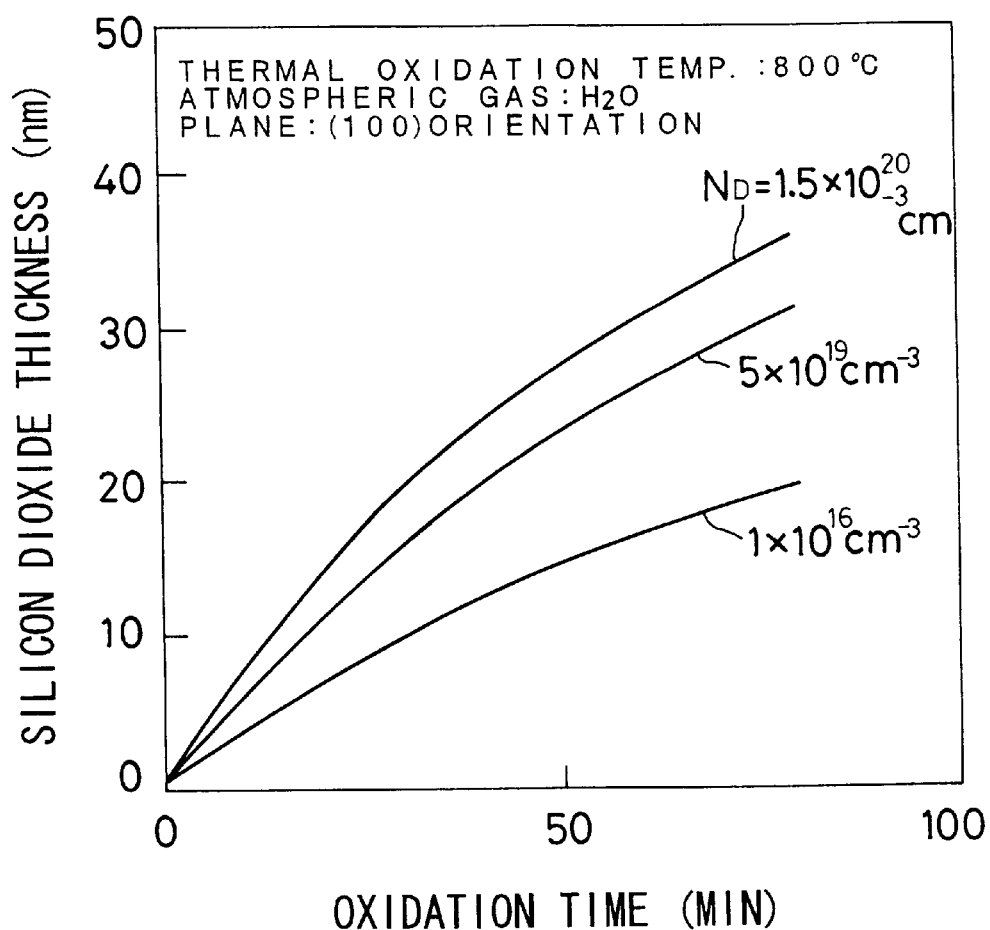
FIG. 7 is a graph showing the dependency of a thickness of a gate oxide layer on concentration of impurities.

Thicknesses of the gate insulators 28, 28a and 29 are varied dependently on a crystal plane of single crystal silicon, as having been mentioned with reference to FIG. 4 in the first embodiment, and are further dependent on concentration of n-type impurities such as arsenic (As) and phosphorus (P) contained in the silicon substrate 21, as shown in FIG. 7. Hereinbelow will be explained a relationship between a thickness of the gate insulators and concentration of impurities with reference to FIGS. 4 and 7.

FIG. 7 shows a relationship between a thickness of a silicon dioxide and thermal oxidation time in various concentrations of n-type impurities with respect to a silicon substrate having (100) orientation. Thermal oxidation temperature is 800 degrees centigrade, and atmospheric gas for oxidation is H$_2$O. As is obvious from FIG. 7, high growth rate thermal oxidation occurs when concentration of n-type impurities is $5 \times 10^{19}$ atoms/cm$^3$ and $1.5 \times 10^{20}$ atoms/cm$^3$. As a result, a thickness of a silicon dioxide layer is about 1.5 to 2 times greater than a thickness of a silicon dioxide layer thermally oxidized in the presence of n-type impurities having concentration of $1 \times 10^{16}$ atoms/cm$^3$. It should be noted that thermal oxidation speed when concentration of n-type impurities is $1 \times 10^{16}$ atoms/cm$^3$ is the same as thermal oxidation speed of a silicon substrate containing p-type impurities therein.

As having been described with reference to FIG. 4, thermal oxidation speed is greater in (110) oriented crystal plane than in (100) oriented crystal plane.

It is possible to control a thickness of a gate insulator by concentration of n-type impurities and/or crystal plane of single crystal silicon. By carrying out such a control, for instance, the first gate insulator 28 is about 12 nm thick on the side walls 25 of the trench 24, while about 14 nm on the bit line diffusion layer 27 containing arsenic by concentration of $5 \times 10^{19}$ atoms/cm$^3$. Thus, there can be formed the first gate insulators 28 and 28a having a thickness about 1.5 times greater than that of the second gate insulator 29.

Then, as illustrated in FIG. 5C, over a resultant is deposited a thin gate electrode layer 30 having a thickness of about 300 nm. The thin gate electrode layer 30 is composed of a polysilicon layer or a tungsten polycide layer containing phosphorus therein. Then, a gate electrode resist mask 31 is patterned on the thin gate electrode layer 30 by means of photolithography technique, and subsequently the thin gate electrode layer 30 is anisotropically dry etched. For instance, mixture gas of Cl$_2$, SF$_6$, and HBr is used as etching gas. Thus, as illustrated in FIG. 5D, transfer gate electrodes 32 and 32a are formed on the first gate insulators 28 and 28a formed on the side walls 25 of the trench 24. In addition, a peripheral transistor gate electrode 33 is formed on the second gate insulator 29 formed on the flat main surface of the silicon substrate 21. The transfer gate electrodes 32 and 32a are formed in self-aligning manner during the above mentioned anisotropic dry etching from the thin gate electrode layer 30 having remained on the side walls 25 of the trench 24.

Then, arsenic ions are implanted into the silicon substrate 21 through the main surface thereof. Dose of arsenic ions is $1 \times 10^{15}$ atoms/cm$^3$, and implantation energy is 50 KeV. By the ion implantation, there are formed capacitor electrode diffusion layers 34, 34a and peripheral transistor diffusion layers 35, 36.

Then, as illustrated in FIG. 5E, a first interlayer dielectric 37 is deposited over a resultant. The first interlayer dielectric 37 is composed of a silicon dioxide layer or BPSG, a silicon dioxide layer containing boron glass and phosphorus glass therein, formed by CVD. Then, the first interlayer dielectric 37 is dry etched to thereby form a bit line contact hole 38 above the bit line diffusion layer 27 and further a first contact hole 39 above the peripheral transistor diffusion layer 35. Subsequently, a thin polysilicon layer containing phosphorus therein is deposited and then patterned to thereby form bit lines 40, and at the same time the contact holes 38 and 39 are filled with the thin polysilicon layer as conductive material.

Then, as illustrated in FIG. 5F, a second interlayer dielectric 41 is deposited all over a resultant. The second interlayer dielectric 41 is formed by the steps of deposition of a silicon dioxide layer by means of CVD and chemical and mechanical polishing (CMP) of a surface of the deposited silicon dioxide layer. Then, the first and second interlayer dielectrics 37 and 41 are dry etched to thereby form capacitor electrode contact holes 42 and 42a above the capacitor electrode diffusion layers 34 and 34a, respectively. Subsequently, a polysilicon layer containing phosphorus therein is deposited over a resultant, and then patterned to thereby form capacitor electrodes 43 and 43a, and at the same time the capacity electrode contact holes 42 and 42a are made filled with the polysilicon layer as conductive material.

Then, as illustrated in FIG. 5G, there is formed a capacitor dielectric 44 covering the capacitor electrodes 43 and 43a therewith. The capacitor dielectric 44 is composed of a layer having high dielectric constant such as a silicon nitride and a tantalum oxide deposited by CVD, or a layer composed of combination thereof. A cell plate electrode 45 is formed by entirely covering the capacitor dielectric 44. The cell plate electrode 45 is composed of a multi-layered structure of a thin titanium nitride layer and a thin tungsten layer. Thereafter, a third interlayer dielectric 46 composed of silicon dioxide is deposited over a resultant by CVD. Then, the first, second, and third interlayer dielectrics 37, 41, 46 are dry etched to thereby form a second contact hole 47 above the peripheral transistor diffusion layer 36. Then, a barrier conductive layer 48 composed of laminated layers of titanium/titanium nitride is deposited on the third interlayer dielectric 46, and the second contact hole 47 covered with the barrier conductive layer 48 is filled with tungsten as conductive material 49. Then, aluminum is deposited over the barrier conductive layer 48 and patterned to thereby form interconnections 50.

Thus, within the trench 24 of the silicon substrate 21 are fabricated two MOS transistors each having a gate insulator comprising the first gate insulator 28 or 28a composed of a relatively thick silicon dioxide, and also having a gate electrode comprising the transfer gate electrode 32 or 32a. On the other hand, on the flat main surface of the silicon substrate 21 is fabricated a MOS transistor having a gate insulator comprising the second gate insulator 29 composed of a thin silicon dioxide, and also having a gate electrode comprising the peripheral transistor gate electrode 33.

FIG. 6 is a rough top plan view of the semiconductor device illustrated in FIGS. 5A to 5G. In FIG. 6, the capacitor electrodes 43, 43a and parts disposed above the capacitor electrodes 43, 43a are omitted for better understanding of the structure of the semiconductor device. As illustrated in FIG. 6, the transfer gate electrodes 32 and 32a is formed on and along the side walls of the trench 24 shaped in an elongated slit. For his reason, the trench 24 is designed to have nearly equal length to that of a word line of the memory cell. A pair of the transfer gate electrodes 32 and 32a are cut off at longitudinal ends (not illustrated) of the trench 24. Thus, in the second embodiment, the trench 24 extends across the insulators 22 for isolation of elements (see an area W encircled with a broken line). In addition, the trench 24 is designed to have a smaller depth than a depth of the insulators 22.

In DRAM, a higher voltage is applied to a transfer gate electrode of a memory cell than a gate electrode of a peripheral transistor. For instance, in 256 megabit DRAM, a voltage of about 3 V is applied to the former, while a voltage of about 2 V is applied to the latter. Thus, it can be understood that the first and second gate insulators 28, 28a and 29 can sufficiently withstand such voltages.

Embodiment 3

Hereinbelow is explained a semiconductor device and a method for fabricating it in accordance with the third embodiment of the invention, with reference to FIGS. 8A to 8G. FIGS. 5A to 5G are arranged in an order with which the method is carried out. In the third embodiment, a semiconductor device in accordance with the invention is to be applied to DRAM similarly to the second embodiment.

Figure 8A:
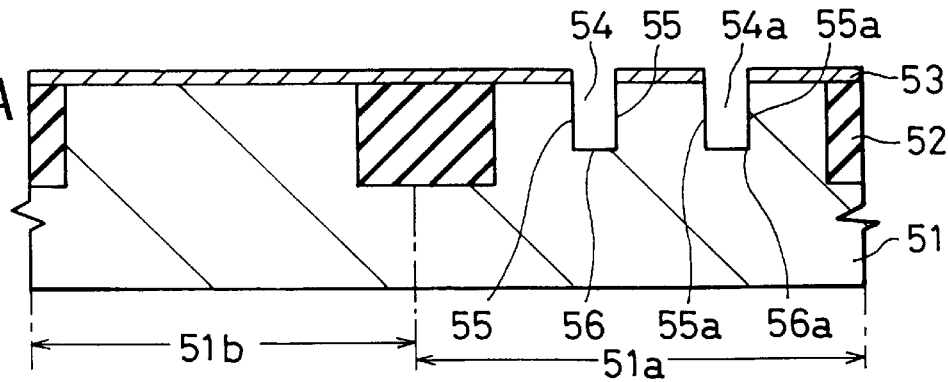

As illustrated in FIG. 8A, a plurality of insulative layers 52 are formed on a main surface of a p-type (100) oriented silicon substrate 51 for isolating elements from each other. The insulators 52 define an area 51a in which a memory cell of DRAM is to be fabricated, and an area 51b in which a peripheral circuit is to be fabricated. The insulators 52 are designed to have a depth of about 1 μm. Then, a silicon dioxide layer 53 is deposited over the main surface of the silicon substrate 51, and then patterned. Then, the silicon substrate 51 is dry etched with the mask oxide layer 53 serving as a mask so that first and second trenches 54 and 54a are formed adjacent to each other. Each of the first and second trenches 54 and 54a has a depth of about 0.5 μm. The first and second trenches 54 and 54a are etched so that side walls 55 and 55a thereof have (110) orientation similarly to the second embodiment. Bottom surfaces 56 and 56a of the trenches 54 and 54a have (100) orientation.

Figure 8B:
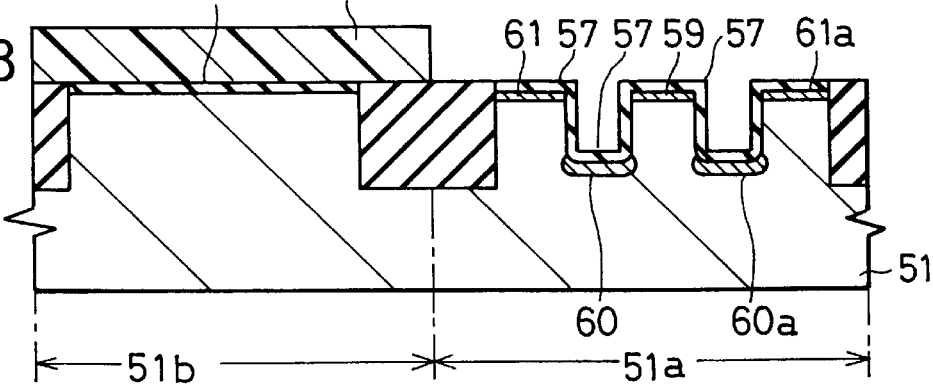

After removal of the mask silicon dioxide layer 53, as illustrated in FIG. 8B, a surface of the silicon substrate 51 is subject to thermal oxidation to thereby form a protection insulative film 57 over a resultant except the insulators 52. Then, a resist mask 58 is formed only in the area 51b, and arsenic ion is implanted into the memory cell region 51a with the resist mask 58 serving as a mask. By the arsenic ion implantation are formed a bit line diffusion layer 59, channel diffusion layers 60 and 60a, and capacitor electrode diffusion layers 61 and 61a in the memory cell area 51a. Dose of arsenic ions is determined to be about $1\times10^{15}$ atoms/cm$^3$ so that these diffusion layers contain As by the amount of about $5\times10^{19}$ atoms/cm$^3$. Thereafter, the resist mask 58 for ion implantation is removed.

Figure 8C:
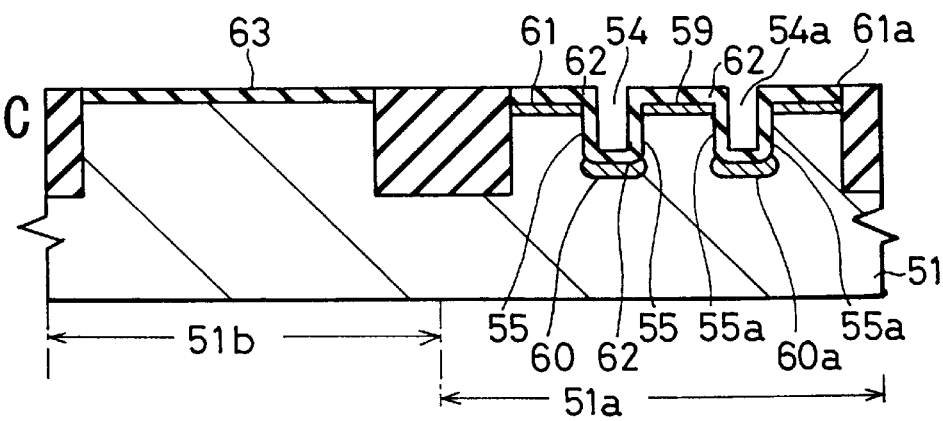

Then, the silicon substrate 51 is thermally oxidized at 800 degrees centigrade in the presence of $H_2O$ as atmospheric gas. As illustrated in FIG. 8C, by the thermal oxidation, a silicon dioxide layer having a thickness of about 12 nm is formed on the side walls 55 and 55a of the first and second trenches 54 and 54a. By the thermal oxidation are further formed a silicon dioxide layer having a thickness of about 14 nm on the bit line diffusion layer 59, channel diffusion layers 60 and 60a, and capacitor electrode diffusion layers 61 and 61a. These silicon dioxide layers work as a first gate insulator 62. On the other hand, as illustrated in FIG. 8C, a silicon dioxide layer or a second gate insulator 63 having a thickness of about 8 nm is formed on the main surface of the silicon substrate 51 in the peripheral circuit area 51b. The reason why the first gate insulator 62 has a different thickness from that of the second gate insulator 63 is the same as the reason set forth in the second embodiment.

Figure 8D:
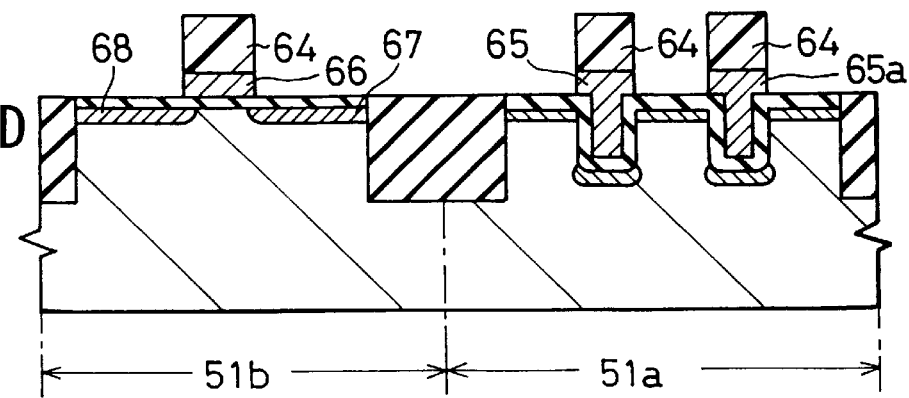

Then, a thin gate electrode layer is deposited over a resultant. Over the thin gate electrode layer is patterned a resist mask 64, and then the thin gate electrode layer is patterned with the resist mask 64 serving as a mask to thereby form first and second transfer gate electrodes 65 and 65a filling the trenches 54 and 54a therewith, respectively, as illustrated in FIG. 8D. On the second gate insulator 63 is formed a peripheral transistor gate electrode 66. Then, the peripheral circuit area 51b is subject to As ion implantation and heat treatment with the result that peripheral transistor diffusion layers 67 and 68 are diffused at opposite sides of the peripheral transistor gate electrode 66.

After removal of the resist mask 64, a first interlayer dielectric 69 is deposited all over a resultant. The first interlayer dielectric 69 is formed by the steps of depositing a silicon dioxide layer by CVD and flattening a surface of the deposited silicon dioxide layer by CMP. Thereafter, the first interlayer dielectric 69 is dry etched to thereby form a bit line contact hole 70 above the bit line diffusion layer 59 and a first contact hole 71 on the peripheral transistor diffusion layer 67. Then, a thin polysilicon layer containing phosphorus therein is deposited over a resultant, and is patterned to thereby form bit lines 72. While the formation of the bit lines 72, the bit line contact hole 70 and the first contact hole 71 is filled with polysilicon serving as a conductor.

Then, as illustrated in FIG. 8F, a second interlayer dielectric 73 is deposited all over a resultant. The second interlayer dielectric 73 is formed by the steps of depositing a silicon dioxide layer by CVD and flattening a surface of the deposited silicon dioxide layer by CMP, similarly to the first interlayer dielectric 69.

The following steps are identical with those of the second embodiment. As illustrated in FIG. 8F, above the capacitor electrode diffusion layers 61 and 61a are formed capacitor electrode contact holes 74 and 74a, respectively, and further above the capacitor electrode contact holes 74 and 74a are pattern capacitor electrodes 75 and 75a, respectively. The capacitor electrodes 75 and 75a are composed of polysilicon containing phosphorus. During the formation of the capacitor electrodes 75 and 75a, the contact holes 74 and 74a are filled with polysilicon.

Then, as illustrated in FIG. 8G, the capacitor electrodes 75 and 75a are covered with a capacitor dielectric 76. Over the capacitor dielectric 76 is deposited a cell plate electrode 77, over which is in turn deposited a third interlayer dielectric 78. Thereafter, a second contact hole 79 are formed, and a barrier conductive layer 80 is deposited over a resultant. Then, the second contact hole 79 is filled with conductive material 81 such as tungsten (W), and then an aluminum layer is deposited over a resultant and is patterned together with the barrier conductive layer 80 to thereby form interconnections 82 in the same way as that of the second embodiment.

Thus, a transfer transistor of DRAM memory cell is formed in each of the trenches. The gate insulator of the transfer transistor, or the first gate insulator 62, is designed to have a greater thickness than that of the gate insulator of a transistor formed in the peripheral circuit area 51b, or the second gate insulator 63.

In the embodiment, a channel region of a transfer transistor is formed at the side walls of the trenches 54 and 54a. Accordingly, the channel length of a transistor is greater than that of the second embodiment. Thus, the third embodiment has an advantage that a depth of a trench can be designed to be shorter than that of the second embodiment.

In the above mentioned first to third embodiments, (100), (110) and (111) oriented crystal planed have been exemplified. However, it should be noted that selection of crystal planes having orientations other than (100), (110) and (111) brings the same advantages as those brought by the first to third embodiments. For instance, orientations nearly equal to (100), (110) and (111) may be selected.

While the present invention has been described in connection with certain preferred embodiments, it is to be understood that the subject matter encompassed by way of the present invention is not to be limited to those specific embodiments. On the contrary, it is intended for the subject matter of the invention to include all alternatives, modifications and equivalents as can be included within the spirit and scope of the following claims.

What is claimed is:

1. A semiconductor device comprising:
a first MOS transistor comprising:
   a main surface having recesses formed thereon;
   an inner surface of said recesses defining a crystal plane having a thermal oxidation speed higher than that of said main surface; and
   an insulator formed on said inner surface of said recesses,
   said inner surface of said recesses working as a channel region and said insulator working as a gate insulator in said first MOS transistor; and
a second MOS transistor wherein said main surface works as a channel region and an insulator formed on said main surface works as a gate insulator,
said gate insulator of said first MOS transistor having a greater thickness than that of said gate insulator of said second MOS transistor.

2. The semiconductor device as recited in claim 1, wherein said main surface has (100) orientation and said inner surface of said recesses has (111) orientation.

3. The semiconductor device as recited in claim 1, wherein said main surface has (100) orientation and said inner surface of said recesses has (110) orientation.

4. The semiconductor device as recited in claim 1, wherein said main surface has (100) orientation and said inner surface of said recesses include crystal planes having (111) or (110) orientation and (100) orientation, said crystal plane having (100) orientation containing highly concentrated impurities therein.

5. The semiconductor device as recited in claim 1, wherein said recesses are V-shaped.

6. The semiconductor device as recited in claim 5, wherein said V-shaped recesses have a depth up to 0.5 μm.

7. The semiconductor device as recited in claim 1, wherein thermal oxidation speed of said crystal plane of said recesses is controlled with thermal oxidation temperature.

8. The semiconductor device as recited in claim 1, wherein thermal oxidation speed of said crystal plane of said recesses is controlled with atmospheric gas.

9. The semiconductor device as recited in claim 1, wherein thermal oxidation speed of said crystal plane of said recesses is controlled with concentration of impurities contained therein.

10. A semiconductor device comprising metal oxide semiconductor field effect transistors (MOSFETs) having different gate oxide breakdown voltages formed thereon, comprising:
a semiconductor substrate having a flat surface of a first crystal orientation;
a recess formed in said flat surface having recess walls of a second crystal orientation;
a first MOSFET having source and drain regions formed beneath said flat surface;
a first gate insulator over said first MOSFET source and drain regions on said flat surface of a first crystal orientation;
a second MOSFET having source and drain regions formed beneath said flat surface on either side of said recess; and
a second gate insulator formed in said recess along said recess walls of a second crystal orientation, wherein said second crystal orientation promotes a thicker layer of gate oxide than said first crystal orientation such that said second MOSFET transistor has a higher gate oxide breakdown voltage than said first MOSFET.

11. A semiconductor device comprising metal oxide semiconductor field effect transistors (MOSFETs) having different gate oxide breakdown voltages formed thereon as recited in claim 10 wherein said recess is V-shaped.

12. A semiconductor device comprising metal oxide semiconductor field effect transistors (MOSFETs) having different gate oxide breakdown voltages formed thereon as recited in claim 10 wherein said first crystal orientation comprises (100).

13. A semiconductor device comprising metal oxide semiconductor field effect transistors (MOSFETs) having different gate oxide breakdown voltages formed thereon as recited in claim 10 wherein said second crystal orientation comprises (111).

14. A semiconductor device comprising metal oxide semiconductor field effect transistors (MOSFETs) having different gate oxide breakdown voltages formed thereon as recited in claim 10 wherein said second crystal orientation comprises (110).

15. A semiconductor device comprising metal oxide semiconductor field effect transistors (MOSFETs) having different gate oxide breakdown voltages formed thereon as recited in claim 10 wherein said second crystal orientation comprises one of (111) and (110).

16. A semiconductor device comprising metal oxide semiconductor field effect transistors (MOSFETs) having different gate oxide breakdown voltages formed thereon as recited in claim 10 wherein said first crystal orientation comprises (100) and said second crystal orientation comprises one of (111) and (110).

17. A semiconductor device comprising metal oxide semiconductor field effect transistors (MOSFETs) having different gate oxide breakdown voltages formed thereon as recited in claim 10 wherein said recess comprises impurities added to control oxide growth.

18. A semiconductor device comprising metal oxide semiconductor field effect transistors (MOSFETs) having different gate oxide breakdown voltages formed thereon as recited in claim as recited in claim 11 wherein said V-shaped recess is up to 0.5 $\mu$m in depth.

* * * * *